(12) United States Patent
Williams (10) Patent No.: US 8,766,224 B2
(45) Date of Patent: Jul. 1, 2014

(54) ELECTRICALLY ACTUATED SWITCH

(75) Inventor: R. Stanley Williams, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1142 days.

(21) Appl. No.: 11/542,986

(22) Filed: Oct. 3, 2006

(65) Prior Publication Data

US 2008/0090337 A1    Apr. 17, 2008

(51) Int. Cl.
*H01L 45/00*    (2006.01)

(52) U.S. Cl.
USPC ............... 257/2; 257/4; 257/43; 257/E45.003

(58) Field of Classification Search
USPC ........................................................ 257/2, 4
See application file for complete search history.

(56) References Cited

U.S. PATENT DOCUMENTS

| | | | |
|---|---|---|---|
| 4,839,700 A | 6/1989 | Ramesham et al. | |
| 5,687,112 A | 11/1997 | Ovshinsky | |
| 6,087,674 A | 7/2000 | Ovshinsky | |
| 6,204,139 B1 | 3/2001 | Liu et al. | |
| RE37,259 E | 7/2001 | Ovshinsky | |
| 6,458,621 B1 | 10/2002 | Beck | |
| 6,487,106 B1 | 11/2002 | Kozicki | |
| 6,507,061 B1 | 1/2003 | Hudgens et al. | |
| 6,508,061 B2 | 1/2003 | Stuttaford | |
| 6,512,241 B1 | 1/2003 | Lai | |
| 6,670,628 B2 | 12/2003 | Lee | |
| 6,746,892 B2 | 6/2004 | Lee et al. | |
| 6,855,647 B2 | 2/2005 | Beck et al. | |
| 6,870,751 B2 | 3/2005 | Van Brocklin | |
| 6,972,238 B2 * | 12/2005 | Hsu et al. | 257/295 |
| 7,208,372 B2 | 4/2007 | Hsu | |
| 7,292,469 B2 | 11/2007 | Lee et al. | |
| 7,361,924 B2 | 4/2008 | Breuil et al. | |
| 7,374,174 B2 | 5/2008 | Liu | |
| 7,381,982 B2 | 6/2008 | Hsueh | |
| 7,521,122 B2 | 4/2009 | Noro et al. | |
| 7,538,338 B2 * | 5/2009 | Rinerson et al. | 257/4 |
| 7,612,358 B2 | 11/2009 | Joo et al. | |
| 7,618,708 B2 | 11/2009 | Mizuno et al. | |
| 7,738,280 B2 | 6/2010 | Yoshii et al. | |

(Continued)

FOREIGN PATENT DOCUMENTS

| | | |
|---|---|---|
| EP | 1482513 | 12/2004 |
| JP | 2004-355676 | 12/2004 |

(Continued)

OTHER PUBLICATIONS

Ignatiev et al, 2007 Mat. Res. Soc. Symp. Proc. vol. 997 © 2007 Mat. Res. Soc. Resistance Non-volatile Memory- RRAM.*

(Continued)

*Primary Examiner* — Jerome Jackson, Jr.
(74) *Attorney, Agent, or Firm* — David W Collins (57) ABSTRACT

An electrically actuated switch comprises a first electrode, a second electrode, and an active region disposed therebetween. The active region comprises at least one primary active region comprising at least one material that can be doped or undoped to change its electrical conductivity, and a secondary active region comprising at least one material for providing a source/sink of ionic species that act as dopants for the primary active region(s). Methods of operating the switch are also provided.

3 Claims, 7 Drawing Sheets

(56) References Cited

U.S. PATENT DOCUMENTS

| | | | |
|---|---|---|---|
| 7,820,064 | B2 | 10/2010 | Jin |
| 7,897,955 | B2 | 3/2011 | Jin |
| 7,998,804 | B2 | 8/2011 | Park et al. |
| 8,029,722 | B2 | 10/2011 | Mattila et al. |
| 2002/0172064 | A1 | 11/2002 | Chen |
| 2003/0173612 | A1 | 9/2003 | Krieger |
| 2005/0079551 | A1 | 4/2005 | Mizuno et al. |
| 2005/0127524 | A1 | 6/2005 | Sakamoto et al. |
| 2005/0180189 | A1 | 8/2005 | Happ |
| 2006/0049390 | A1 | 3/2006 | Ufert et al. |
| 2006/0076549 | A1 | 4/2006 | Ufert |
| 2006/0098472 | A1* | 5/2006 | Ahn et al. .................. 365/145 |
| 2006/0121391 | A1 | 6/2006 | Khang et al. |
| 2006/0126423 | A1 | 6/2006 | Aratani et al. |
| 2006/0152961 | A1 | 7/2006 | Kim et al. |
| 2006/0160304 | A1 | 7/2006 | Hsu et al. |
| 2006/0175598 | A1 | 8/2006 | Krieger |
| 2006/0175646 | A1 | 8/2006 | Gaun |
| 2006/0268598 | A1 | 11/2006 | Snider |
| 2006/0291268 | A1 | 12/2006 | Happ et al. |
| 2007/0012956 | A1 | 1/2007 | Gutsche et al. |
| 2007/0045704 | A1 | 3/2007 | Ufert et al. |
| 2007/0090444 | A1 | 4/2007 | Park et al. |
| 2007/0167008 | A1 | 7/2007 | Hsu et al. |
| 2008/0079029 | A1 | 4/2008 | Williams |
| 2008/0090337 | A1 | 4/2008 | Williams |
| 2008/0099820 | A1 | 5/2008 | Coppard et al. |
| 2008/0206931 | A1 | 8/2008 | Breuil |
| 2008/0268288 | A1 | 10/2008 | Jin |
| 2008/0308783 | A1 | 12/2008 | Ahn et al. |
| 2009/0081431 | A1 | 3/2009 | Mattila et al. |
| 2009/0233422 | A1 | 9/2009 | Krieger et al. |
| 2009/0236079 | A1 | 9/2009 | Khodadadi |
| 2010/0127232 | A1 | 5/2010 | Boeve et al. |
| 2011/0221027 | A1 | 9/2011 | Quitoriano et al. |
| 2011/0227022 | A1 | 9/2011 | Cho |
| 2011/0227030 | A1 | 9/2011 | Pickett |
| 2011/0228593 | A1 | 9/2011 | Strukov |
| 2011/0261608 | A1 | 10/2011 | Borghetti et al. |
| 2011/0266510 | A1 | 11/2011 | Quitoriano et al. |
| 2011/0266513 | A1 | 11/2011 | Williams et al. |

FOREIGN PATENT DOCUMENTS

| | | |
|---|---|---|
| JP | 2005028734 | 2/2005 |
| JP | 2005-509266 | 4/2005 |
| JP | 2006-173267 | 6/2006 |
| JP | 2008-505499 | 2/2008 |
| JP | 2008-512857 | 4/2008 |
| WO | 03/058638 A1 | 7/2003 |
| WO | WO-03094227 | 11/2003 |
| WO | WO-2006007525 | 1/2006 |
| WO | WO-2006075574 | 7/2006 |

OTHER PUBLICATIONS

Mead, C.A. "Metal-Semiconductor Surface Barriers" Solid State Electronics, 1966 vol. 9 pp. 1023-1033.*

Nian et al, "Evidence . . . Transition-Metal Oxides" PRL 98, 146403, Apr. 4, 2007.*

Schroter W., Lautenschlager K.-H., Bibrack H., Taschenbuch der Chemie, 1988, Verlag Harri Deautsch, Thun und Frankfurt.M., 13. Auflage, S. 137.

International Search Report; PCT Patent Application No. PCT/US2007/021357, filed Mar. 10, 2007; search issued by the European Patent Office (ISA) Nov. 20, 2008.

Choi, B.J. et al, "Resistive switching mechanism of TiO2 thin films grown by atomic-layer deposition", Journal of Applied Physics 98, 033715, copyright 2005, pp. 033715-1 through 033715-10.

Rothchild, A et al, "Electronic and transport properties of reduced and oxidized nanocrystalline TiO2 Films", Applied Physics Letters, vol. 82, No. 4, Jan. 27, 2003, pp. 574-576.

Blanc, Joseph et al, "Electrocoloration in SrTiO3: Vacancy Drift and Oxidation-Reduction of Transition Metals", Physical Review B, vol. 4, No. 10, Nov. 15, 1971, pp. 3548-3557.

Knauth, P., Defect and transport properties of nonocrystalline ceramics and thin films, J. Solid State Electrochem (2002), vol. 6, pp. 165-171.

Weibel, A., et al, Electrical properties and defect chemistry of anatase (TiO2), Solid State Ionics 177 (2006), Elsevier, www.elsevier.com, pp. 229-236.

Hewlett-Packard Development Co., DE Application No. 112007002328.7-33, German Office Action, drafted Mar. 17, 2010, English Translation rcvd May 14, 2010.

J.M.D Coey, et al, "Mixed-Valence Manganites", Advances in Physics. 1999, V. 48(2), pp. 167-293.

PCT International Search Report, Nov. 20, 2008, PCT/US2007/021357.

PCT International Search Report, Aug. 26, 2009, PCT/US2009/030827.

Yoo et al., "Site-Specific Magnetic Assembly of Nanowires for Sensor Arrays Fabrication", IEEE Transactions on Nanotechnology, vol. 7 Issue 3 pp. 251-255.

* cited by examiner

ELECTRICALLY ACTUATED SWITCH

STATEMENT OF GOVERNMENT INTEREST

This invention has been made with Government support under Agreement number HR0011-0503-0001, awarded by the Defense Advanced Research Projects Agency. The government has certain rights in this invention.

TECHNICAL FIELD

The present invention is directed to electronic switches, and, more particularly, to electrically actuated switches.

BACKGROUND ART

During the past decade, many researchers have been intrigued by the prospect of building electronic circuits based on molecular or molecular-scale components. The potential of molecular electronics has been to bring the power of synthetic chemistry to the electronics industry by creating purpose-built devices that may be able to at least partially assemble themselves into useful circuits. This prospective has led to a significant number of studies of the electronic properties of molecules and the demonstration of some proof-of-principles of memory and logic circuits.

Studies of switching in nanometer-scale crossed-wire devices have previously been reported that could be switched reversibly and had an ON-to-OFF conductance ratio of $10^4$. These devices have been used to construct crossbar circuits and provide a promising route for the creation of ultra-high density nonvolatile memory. A series connection of cross-wire switches that can be used to fabricate a latch has also been demonstrated; such a latch is an important component for logic circuits and for communication between logic and memory. New logic families that can be constructed entirely from crossbar arrays of switches or as hybrid structures composed of switches and transistors have been described. These new logic families have the potential to dramatically increase the computing efficiency of CMOS circuits, thereby enabling performance improvements of orders of magnitude without having to shrink transistors, or to even replace CMOS for some applications if necessary. However, it is desired to improve the performance of the devices that are presently fabricated, especially their cyclability.

SUMMARY

An electrically actuated switch comprises a first electrode, a second electrode, and an active region disposed therebetween. The active region may comprise at least one primary active region comprising at least one material for transporting and hosting ions that act as dopants to control the flow of electrons through the switch, and a secondary active region comprising at least one material for providing a source of ionic dopants for the primary active region(s). Methods of operating the switch are also provided.

BRIEF DESCRIPTION OF THE DRAWINGS

FIGS. 6A-6C are schematic diagrams of an exemplary switch in the OFF state, in which

FIGS. 7A-7C are schematic diagrams of an exemplary switch in an intermediate state, in which

FIGS. 8A-8C are schematic diagrams of an exemplary switch in the ON state, in which

DETAILED DESCRIPTION

The figures depict embodiments of the present invention for purposes of illustration only. One skilled in the art will readily recognize from the following discussion that other embodiments of the structures and methods illustrated herein may be employed without departing from the principles of the invention described herein.

Definitions.

As used herein, the term "self-aligned" as applied to "junction" means that the junction that forms the switch and/or other electrical connection between two wires is created wherever two wires, either of which may be coated or functionalized, cross each other, because it is the act of crossing that creates the junction.

The term "self-assembled" as used herein refers to a system that naturally adopts some geometric pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read only memory (PROM), for example.

The term "reconfigurable" means that a switch can change its state multiple times via a reversible process such as an oxidation or reduction; in other words, the switch can be opened and closed multiple times such as the memory bits in a random access memory (RAM).

The term "configurable" means either "singly configurable" or "reconfigurable".

Micron-scale dimensions refers to dimensions that range from 1 micrometer to a few micrometers in size.

Sub-micron scale dimensions refers to dimensions that range from 1 micrometer down to 0.04 micrometers.

Nanometer scale dimensions refers to dimensions that range from 0.1 nanometers to 50 nanometers (0.05 micrometers).

Micron-scale and submicron-scale wires refers to rod or ribbon-shaped conductors or semiconductors with widths or diameters having the dimensions of 0.04 to 10 micrometers, heights that can range from a few nanometers to a micrometer, and lengths of several micrometers and longer.

A crossbar is an array of switches that can connect each wire in one set of parallel wires to every member of a second set of parallel wires that intersects the first set (usually the two sets of wires are perpendicular to each other, but this is not a necessary condition).

As used herein, the functional dimension of the device is measured in nanometers (typically less than 50 nm), but the lateral dimensions may be nanometers, sub-microns or microns.

Background on Nanowire Junctions.

Figure 1A:
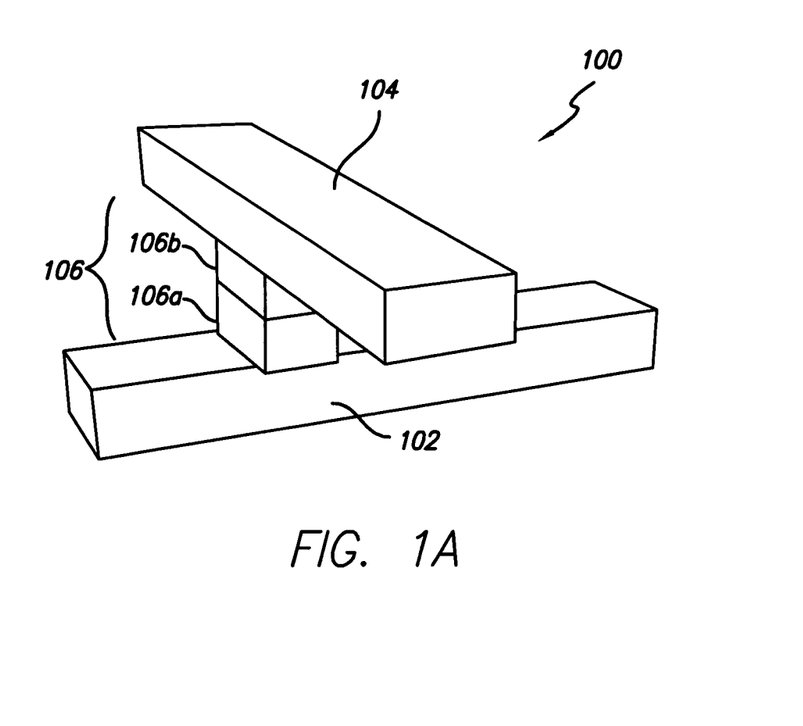
FIG. 1A is a perspective view of an example of a solid-state switch connecting two different crossed wires.

FIG. 1A illustrates an example of a solid-state switch 100 connecting two different crossed wires 102, 104. A switch junction 106 may be used to connect the two different wires 102, 104. The switch junction 106 may comprise at least one material 106a, specifically, a switchable molecule (i.e., a molecule having a switchable segment or moiety that is relatively energetically stable in two different states); examples of such molecules are now well known in the field of molecular electronic (moletronic) switching. One or both wires 102, 104 may be metal or semiconductor. In many cases, both wires are metal, specifically, platinum, and a thin titanium layer 106b is formed over the molecule 106a and then the platinum top wire 104 is formed over the titanium layer.

Figure 1B:
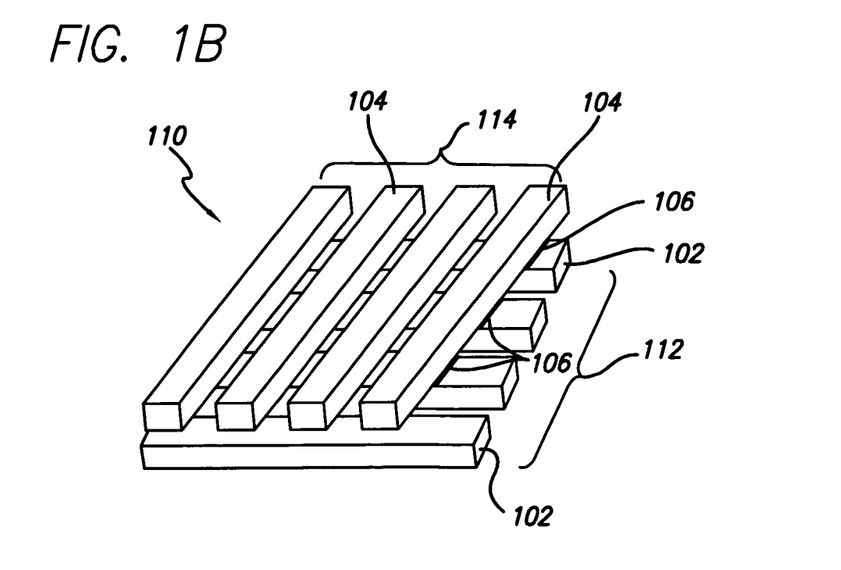
FIG. 1B is a view similar to that of FIG. 1A, showing an array of the switches of FIG. 1A, also known as a crossbar.

FIG. 1B illustrates a crossbar array 110 employing a plurality of the solid-state switches 100 shown in FIG. 1A. As shown in FIG. 1B, a first layer 112 of approximately parallel wires 102 is overlain by a second layer 114 of approximately parallel wires 104. The second layer 114 is roughly perpendicular, in orientation, to the wires of the first layer 112, although the orientation angle between the layers may vary. The two layers of wires form a lattice, or crossbar, each wire 104 of the second layer 114 overlying all of the wires 102 of the first layer 112 and coming into close contact with each wire of the first layer at wire intersections that represent the closest contact between two wires. The switch junction 106 is shown disposed between wires 102, 104. (Three such switch junctions are shown, so as not to clutter the drawing; it will be appreciated that a switch junction 106 is formed at each intersection of a wire 102 with a wire 104.) Such crossbars may be fabricated from micron-, submicron- or nanoscale-wires, depending on the application.

Although individual wires in the figures are shown with square or rectangular cross-sections, wires can also have circular, elliptical, or more complex cross-sections. The wires may also have many different widths or diameters and aspect ratios or eccentricities. The term "nanowire crossbar" may refer to crossbars having one or more layers of sub-microscale wires, microscale wires or wires with larger dimensions, in addition to nanowires.

Figure 2:
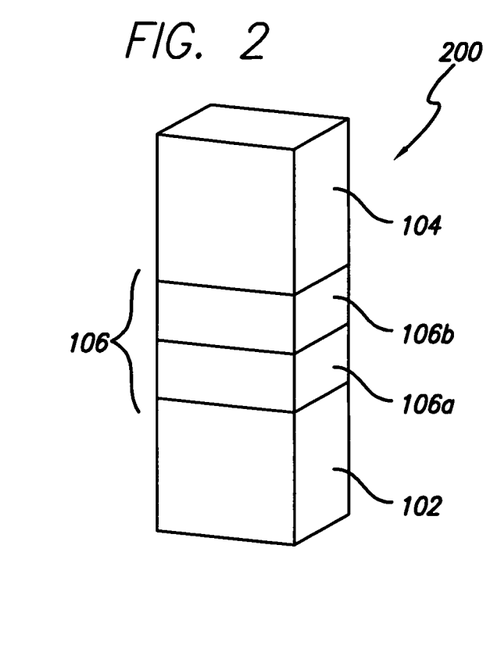
FIG. 2 is a perspective view of an example of a solid-state switch connecting two segments of a wire.

FIG. 2 is an example of a solid-state switch connecting two segments of a nanowire. Here, two segments 102, 104 of the nanowire are connected by switching junction 106, comprising switching layer 106a and thin titanium layer 106b, both as described above.

As is well known, such switches may be used as the basis for memories (e.g., the storage of a bit of information, 1 or 0), as either a closed or open switch in a cross-point memory, for configuration bits in a logic circuit that resembles a Field Programmable Gate Array, or as the basis for a wired-logic Programmable Logic Array. These switches also find uses in a wide variety of other applications.

Electrically Actuated Switch.

In accordance with the teachings herein, an improved electrically actuated switch is provided that may be built at the micro- or nano-scale and used as a component in a wide variety of electronic circuits. The switch may be used to connect two different wires, such as a pair of crossing wires shown in FIGS. 1A-1B, which may be two wires in a larger crossbar array; or it may be used within a wire in order to allow or block the flow of current along the wire, such as shown in FIG. 2.

The improved switches can be used as the basis for memories, switches, and logic circuits and functions, as described above.

The switches may have the following characteristics:

(1) The primary active layer, or region, of the switch comprises a thin film of a material that is electronically semiconducting or nominally electronically insulating and also a weakly ionic conductor. The primary active material is capable of transporting and hosting ions that act as dopants to control the flow of electrons through the switch. The basic mode of operation is to apply an electrical field (the drift field, which may exceed some threshold for enabling the motion of the ions in the primary material) across' the switch large enough to cause an ionic species to be transported into or out of the primary material via ionic transport. The ionic species are specifically chosen from those that act as electrical dopants for the primary material, and thereby change the electrical conductivity of the material from low conductivity (i.e. an undoped semiconductor or insulator—switch-OFF configuration) to high conductivity (doped to provide a higher conductivity—switch-ON configuration) or from high electrical conductivity to low conductivity (switch-ON to switch-OFF). Furthermore, the primary material and the dopant species are chosen such that the drift of the ions into or out of the primary material is possible but not too facile, to ensure that the switch will remain in whatever state it is set for a reasonably long time, perhaps many years at room temperature. This is to make sure the switch is nonvolatile, that is, that it holds its state after the drift field has been removed. The switch is a two-terminal device—applying a high bias to the switch causes both electron current and ion current to flow, whereas at a low bias the flow of ion current is negligible, which allows the switch to hold its resistance state.

(2) The secondary active layer, or region, comprises a thin film of a material that is a source of dopants for the primary material. These dopants may be impurity atoms such as hydrogen or some other cation species, such as alkali or transition metals, that act as an electron donor for the primary material, or they may be anion vacancies, which in the primary material are charged and therefore are also donors for the lattice. It is also possible to drive anionic species into the primary host material, which will become electron acceptors (or hole donors).

(3) The primary active material may be a thin film (generally less than 50 nm thick), and is in many cases nanocrystalline, nanoporous or amorphous. The mobility of the dopant species in such nanostructured materials is much higher than in a bulk crystalline material, since diffusion can occur through grain boundaries, pores or through local structural imperfections in an amorphous material. Also, because the film is so thin, the amount of time required to drift enough dopants into or out of a local region of the film to substantially change its conductivity is relatively rapid (e.g., the time t required for a diffusive process varies as the square of the distance covered, so the time to diffuse one nanometer is one-millionth the time required to diffuse one micrometer).

(4) The switching materials (primary active and secondary active materials) are contacted on either side by metal electrodes or wires, or on one side by a semiconductor and the other side by a metal. The contact of the metal to the switching material depletes the semiconductor of free charge carriers, so in fact the material has a net charge that depends on the identity of the dopants—positive in the case of donors and negative in the case of acceptors. The metal-semiconductor contact regions electrically resemble Schottky barriers. The traditional description of a metal-semiconductor Schottky barrier is modified by the fact that the materials are structured at the nanometer scale, and so the structural and electrical properties are not averaged over the large distances over which the theory of semiconductor-metal contacts have been developed.

(5) Conduction of electrons through the primary active material is via quantum mechanical tunneling of the electrons. When the semiconducting material is essentially intrinsic, the tunneling barrier is high and wide, and thus the conductivity through the switch is low (OFF state). When a significant number of dopant species have been injected into the semiconductor, the width and perhaps the height of the tunneling barrier are diminished by the potential of the charged species. This results in an increase of the conductivity of the switch (ON state).

(6) The ability of the charged species to diffuse into and out of the primary material is substantially improved if one of the interfaces connecting the switch to the metallic or semiconducting electrodes is non-covalently bonded. Such an interface may be caused by a void in the material or it may be the result of an interface that contains a molecular material that does not form covalent bonds with the electrode, the primary switch material, or both. This non-covalently bonded interface lowers the activation energy of the atomic rearrangements that are required for drift of the ionic species in the primary material. This interface is essentially an extremely thin insulator, and adds very little to the total series resistance of the switch.

As noted above, the primary active material has certain properties that are useful in the practice of the present invention. One of these properties of the material is that it is a weakly ionic conductor. The definition of a weakly ionic conductor is based on the application for which a switch is designed. The mobility and the diffusion constant for a species in a lattice are directly proportional to one another, via the "Einstein relation". Thus, if the mobility of ionized species in a lattice is very high, so is the diffusion constant. In general, it is desired for a switching device to stay in a particular state, ON or OFF, for an amount of time that may range from a fraction of a second to years, depending on the application. Thus, the diffusion constant for such a device is, in an embodiment, low enough to ensure the desired level of stability, to avoid inadvertently turning the device from ON to OFF or vice versa via ionized species diffusion, rather than by intentionally setting the state of the switch with a voltage pulse. Therefore, a "weakly ionic conductor" is one in which the ion mobility, and thus the diffusion constant, is small enough to ensure the stability of the ON or OFF state of the device for as long as necessary under the desired conditions (e.g., the device does not change state because of diffusion of the dopants). "Strongly ionic conductors" would have large ionized species mobilities and thus would not be stable against diffusion.

Figure 3A:
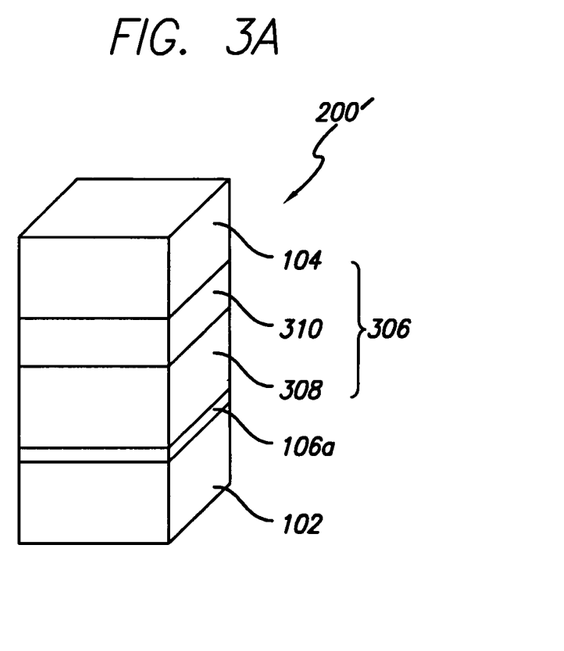
FIG. 3A is a perspective view of a schematic representation of the structure of an exemplary electrically actuated switch, based on the segmented-wire configuration of FIG. 2.

The structure of an embodiment of the switch 200' of the invention is shown in FIG. 3A, employing the in-line configuration of FIG. 2. The structure of another embodiment of the switch 100' of the invention is shown in FIG. 3B, employing the cross-point configuration of FIG. 1A.

Figure 3B:
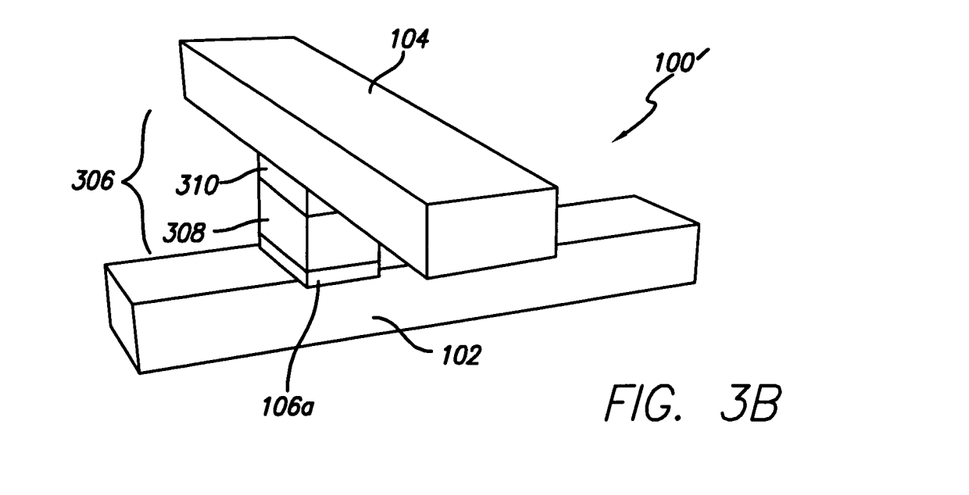
FIG. 3B is a perspective view of a schematic representation of the structure of an exemplary electrically actuated switch, based on the crossed-wire configuration of FIG. 1A.

FIGS. 3A-3B are schematic representations of the structure of an exemplary electrically actuated switch. The active region 306 of the switch has two major components—the primary active layer or region 308, which is a material that is both an electronically semiconducting and weakly ionic conductor layer that can be doped with electron donors as interstitials, vacancies or impurities, and a secondary layer or region 310 that acts as a source and sink of the doping species. Alternatively, the material of the primary active region 308 may be both nominally electrically insulating and a weakly ionic conductor. As discussed below, the active region 306 may optionally include the molecular layer 106a as the non-covalently bonded interface; the molecular layer may comprise molecules that may or may not be switchable.

In an embodiment of switch 200', depicted in FIG. 3A, the two electrodes 102, 104 are both Pt metal, the semiconducting ionic conductor 308 is $TiO_2$, the dopant source 310 is $TiO_{2-x}$, and the optional non-covalent interface comprises the thin molecular layer 106a between the electrode 102 and the primary switching material 308. The formula $TiO_{2-x}$ indicates that the titanium dioxide has a small deficit of oxygen atoms in the crystal structure; the sites where the missing O atoms would be are positively charged vacancies. The dopant species in this case is an oxygen vacancy. Another embodiment of this switch is depicted in FIG. 3B as switch 100', which has the same active region switch structure 306 as FIG. 3A.

A switch that operates via the injection or ejection of donors is turned ON (i.e. the electrical conductance is increased, FIG. 4) or turned OFF (the electrical conductance is decreased, FIG. 5) by increasing or decreasing, respectively, the number of donor dopant sites in the semiconductor layer 308. These donor sites may be interstitial cation species in the host lattice of the semiconductor, anion vacancies in the host lattice, interstitial impurities such as H, or other interstitial or substitutional impurities that act as an electron donor for the semiconductor. Since the thickness of the semiconductor layer 308 is less than the depletion width for carriers in a semiconductor of moderately high doping (e.g., a thickness of approximately 100 nm), this means that the thin semiconductor is completely depleted of free carriers because it is in intimate contact on at least one side with a metal. The electrons reside just inside the metal contacts 102, 104 on either side of the semiconductor 308. As an example, a doping concentration of $10^{18}$ dopant atoms per $cm^3$ (this is "moderately high") corresponds to a depletion layer thickness of 30 nm. A doping concentration of $10^{21}$ $cm^3$ (this is very high doping, but entirely possible for many oxides) corresponds to a depletion thickness of 3 nm.

Figure 4:
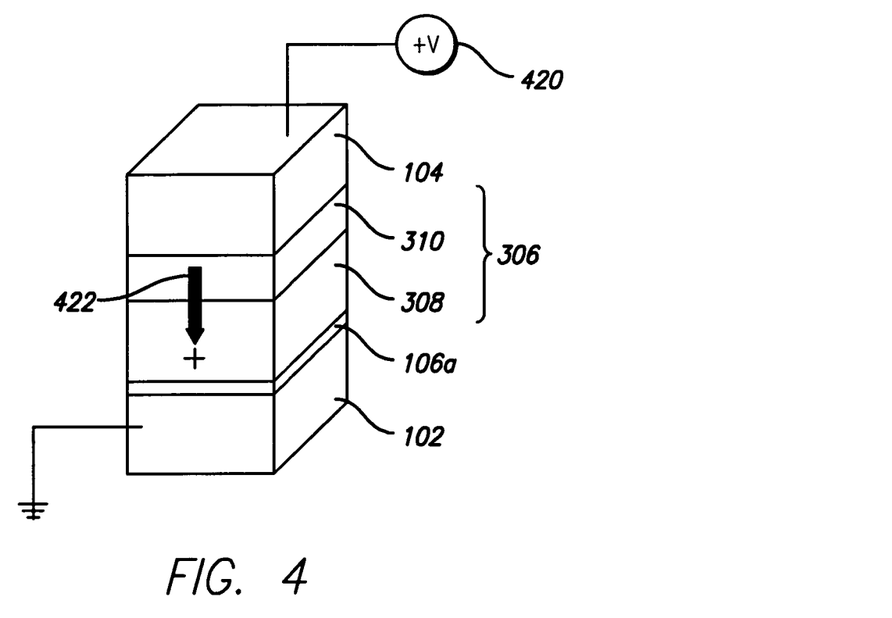
FIG. 4 is a perspective view of a schematic illustration of the beginning process for actuating (or toggling) an exemplary switch to the ON state, based on the segmented-wire configuration of FIG. 3A.

FIG. 4 is a schematic illustration of the beginning process for actuating (or toggling) the switch to the ON state. In this case, positively charged donors such as oxygen vacancies in $TiO_2$ are driven into the semiconductor material 308 from the source/sink material 310 by applying a positive bias voltage 420 across the junction that exceeds the threshold field for the drift of an ionized species. Since the semiconductor layer 308 is totally depleted of charge carriers, this means that the semiconductor layer 308 acquires a net positive charge. Net charge neutrality is maintained by electrons residing in the metal layers 102, 104. For the example discussed above, layer 308 fabricated with stoichiometric $TiO_2$ forms the initial (OFF state) of the switch. The potential difference between the metal contact and the primary semiconductor forms a tunneling barrier to current flow between the Pt electrodes. The $TiO_{2-x}$ layer 310 contains a relatively high concentration of vacancies, and is therefore a reasonably good conductor. Upon the application of a positive voltage to electrode 104, it becomes the anode of an electrochemical cell. Oxygen vacancies are driven out of the $TiO_{2-x}$ layer 310 (it is oxidized) and into the $TiO_2$ layer 308 (it is reduced), as shown by arrow 422. The effect on the electrical conductivity of the $TiO_2$ layer 310 is relatively small since a small number of the vacancies are pushed out of this region, but the electrical conductivity of the $TiO_2$ layer 308 increases dramatically (switch ON) since it is going from a state in which there were no vacancies to one in which there are some.

In the OFF state, the thin semiconductor layer 308 is essentially intrinsic—e.g., there are very few dopants in the lattice. In this case, there is essentially a Schottky barrier on both sides of the semiconductor 308, and the alignment of the semiconductor bands with respect to the metal Fermi level is approximately mid-gap, depending on a variety of physical and chemical issues. For an oxide semiconductor such as $TiO_{2-x}$, which is also a weak ionic conductor, this OFF state of the device is the "fully oxidized" state, e.g., the one in which the stoichiometry of the material is as close to $TiO_2$ as possible and for which there is very little impurity or defect doping. For a semiconductor with an appropriately wide bandgap, there is a large tunnel barrier for current to flow, which makes the conductivity of the OFF switch low.

Figure 5:
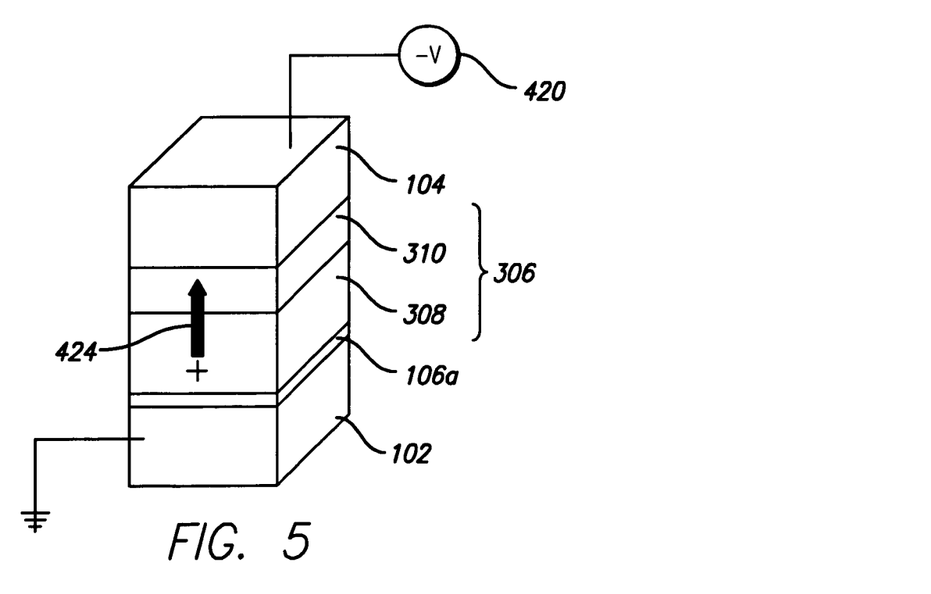
FIG. 5 is a perspective view of a schematic illustration of the beginning process for actuating (or toggling) the switch to the OFF state.

FIG. 5 is a schematic illustration of the beginning process for actuating (or toggling) the switch to the OFF state. Positively charged donors are driven from the semiconductor material 308 into the source/sink material 310 by applying a negative bias voltage 420 across the junction that exceeds the threshold field for the drift of an ionized species (which may be a vacancy). The semiconductor layer 308 loses its net positive charge and again becomes neutral. For the example discussed above, slightly off-stoichiometric $TiO_{2-\delta}$ forms the conductive ON state of the switch because the net positive charge in the layer narrows and lowers the tunneling barrier for electrical current to flow between the electrodes 102, 104. The $TiO_{2-x}$ layer 310 contains a relatively high concentration of vacancies, and is therefore still a reasonably good conductor. Upon the application of a negative voltage to electrode 104, it becomes the cathode of the electrochemical cell. The oxygen vacancies are driven out of the $TiO_{2-\delta}$ layer 308 (it is oxidized again to $TiO_2$) and back into the $TiO_{2-x}$ dopant source layer 310 (it is reduced), as shown by arrow 424. The effect on the conductivity of the $TiO_{2-x}$ layer 310 is relatively small, but the conductivity of the $TiO_2$ layer 308 decreases dramatically (switch OFF).

Without subscribing to any particular theory, it appears that conduction through the primary material is via quantum mechanical tunneling of electrons. When the semiconducting material is essentially intrinsic, the tunneling barrier will be very high and thus the conductivity through the switch is low (OFF state). When a significant number of dopant species have been injected into the semiconductor, the tunneling barrier will be diminished by the potential of the charged species. This will increase the conductivity of the switch (ON state).

FIGS. 6A-6C, 7A-7C, and 8A-8C are schematic diagrams of the switch 200' in various switch states. In each set of Figures, the "A" Figure is the real space picture, or diagram, of the switch 200', the "B" Figure depicts the equivalent electrical circuit, and the "C" Figure is the energy band diagram.

In this embodiment, an exemplary thickness τ of the switch is 2 nm and an exemplary total width $w_0$ of the $TiO_2/TiO_{2-x}$ layer 308, 310 is 3 nm.

Figure 6A:
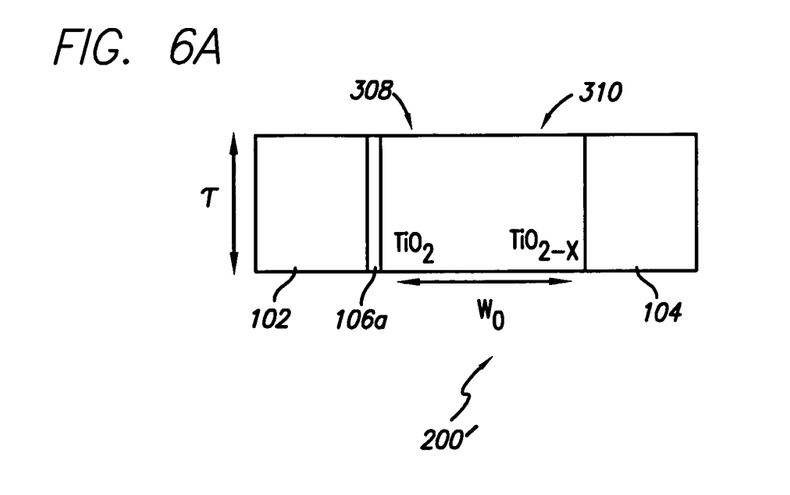
FIG. 6A is a view of the switch.

In FIG. 6A, as an example the switching material 308, 310 may be an anatase (a polytype of titanium dioxide) nanocrystal sandwiched between two Pt electrodes 102, 104. For the purposes of this discussion, it is assumed that this nanocrystal measures 1.9 nm×1.9 nm×2.9 nm and contains a total of 75 anatase unit cells or 900 atoms, which shows that it is small for a band structure to develop but large for a quantum chemical calculation. At this stage, a qualitative picture of the electronic states of the system may be sketched, using a band approach, but this should not to be taken too literally. A single impurity atom or vacancy in this nanocrystal would yield a doping density of $10^{20}$ $cm^{-3}$, and it may be assumed that the nanocrystal may contain as many as 2% oxygen vacancies (e.g., ~12). The metal-semiconductor contact regions electrically resemble Schottky barriers modified by the nanometer scale of the system, so the electrical properties will not be averaged over the large distances for which the theory of semiconductor-metal contacts have been developed.

The $TiO_2$ region 308 adjacent the non-covalent region 106a is stoichiometric and thus highly resistive, as indicated by the large tunneling barrier. The $TiO_{2-x}$ region 310 adjacent the second electrode 104 is highly oxygen deficient, and thus this region is highly conductive. In the band diagram at the top of FIG. 6C, both interfaces 601, 603 are Schottky barriers. On the left is a metal-insulator-semiconductor interface 601 and on the right is an interface 603 between a metal and a highly donor-doped semiconductor for which the band gap has decreased somewhat from the value for stoichiometric $TiO_2$.

Figure 6B:
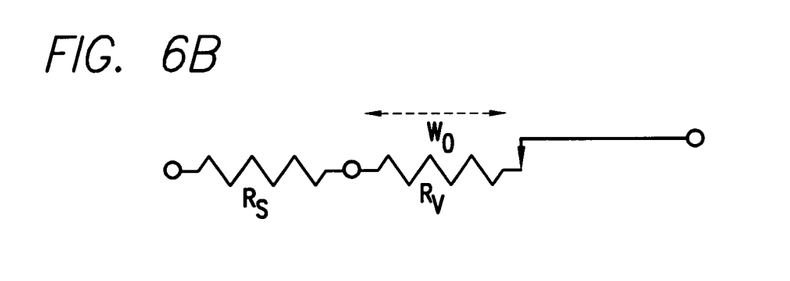
FIG. 6B is an equivalent circuit diagram of the state of the switch.
Figure 6C:
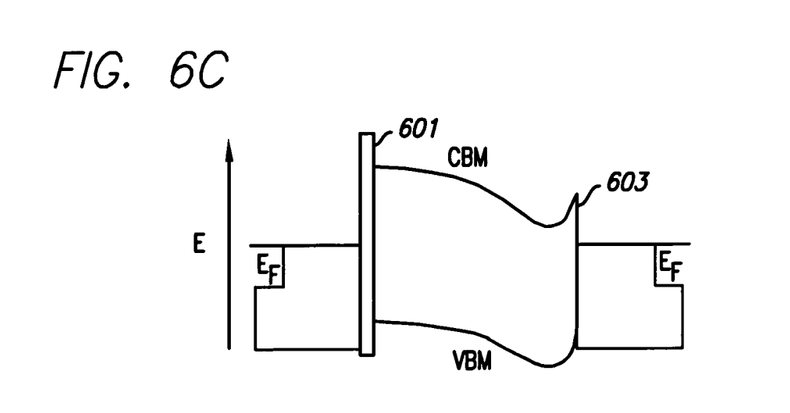
FIG. 6C is the energy band diagram associated with the switch.

The Pt—$TiO_2$ interface 601 on the left-hand side of the diagram of FIG. 6C represents a non-covalently bonded interface between the metal electrode 102 and the semiconductor 308 that is mediated by the intervening molecular layer 106a. A rough band diagram representation is depicted to show that there is a potential barrier at this interface 601. This region of the film is designed and fabricated to be stoichiometric $TiO_2$. The electron affinity of anatase is estimated to be about 4.0 eV and the work function of Pt is 5.64 eV, so a potential barrier height of 1.6 eV can be estimated at this interface 601. The Pt Fermi level should be near the midgap region for anatase, which has a bulk bandgap of 3.2 eV, although it might be wider for the nanocrystal because of quantum confinement. Even for a doping level of $10^{21}$ $cm^{-3}$, the depletion length is ~3 nm in anatase, so the nanocrystal is fully depleted and thus positively charged. The electrons reside in a narrow region in the Pt contacts.

There is a second Pt contact 104 to the nanocrystal on the right-hand side of the diagram of FIG. 6A. In an embodiment, the system is designed and fabricated such that this region of the titanium dioxide has a significant concentration of oxygen vacancies. Thus, in moving from left to right in FIG. 6A, the value of x in $TiO_{2-x}$ goes from zero to a value as high as 0.04. This is a high enough concentration of oxygen vacancies to create a large number of donor states that significantly broaden the density of states near the conduction band edge and thus effectively narrow the band gap. This is shown in the band diagram of FIG. 6C as a lowering of the potential barrier at this interface 603 compared to the left-hand side, caused by the narrowing of the band gap and significant band bending because of the extremely high concentration of positively charged donor states.

In the as-fabricated state illustrated by FIG. 6C, the potential barrier 601 represented by the anatase nanocrystal is large and thus the conductance of this state of the switch is low; this is the switch-OFF state. If the left-hand Pt electrode 102 is grounded and a positive potential is applied to the right-hand electrode 104, which becomes the anode of a nanoscale electrochemical cell, then the positively charged oxygen vacancies will be forced to drift toward the grounded electrode, which is the cathode. The fact that there is a large concentration of vacancies that already exist near the anode means that no vacancies have to be created in order to turn the switch ON. The enthalpy of formation of oxygen vacancies in nanocrystalline anatase is very much larger than the activation energy for vacancy hopping, so having a structure in which there are pre-existing oxygen vacancies (or other appropriate positively charged dopants) near the anode of the switch eliminates the expenditure of a large amount of energy that would occur during preconditioning of a switch to form the vacancies electrically.

Figure 7A:
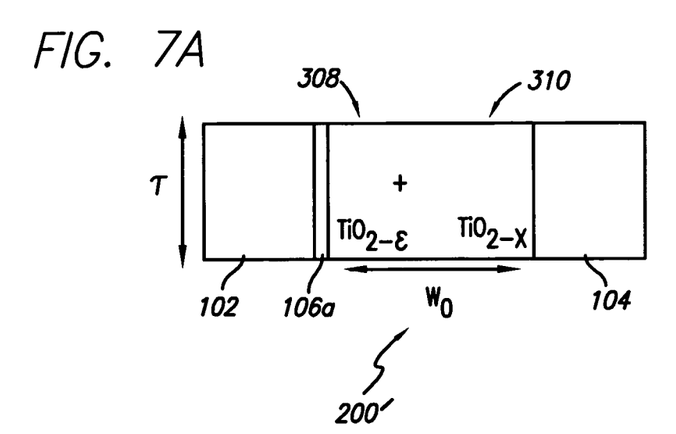
FIG. 7A is a view of the switch.
Figure 7B:
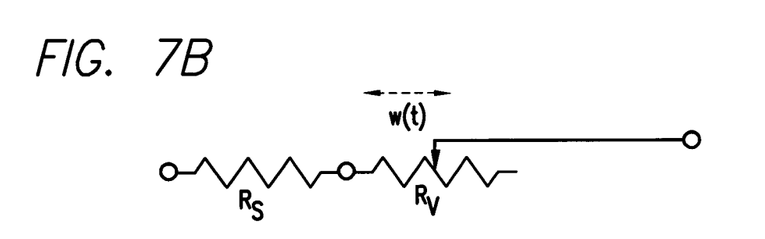
FIG. 7B is an equivalent circuit diagram of the state of the switch.
Figure 7C:
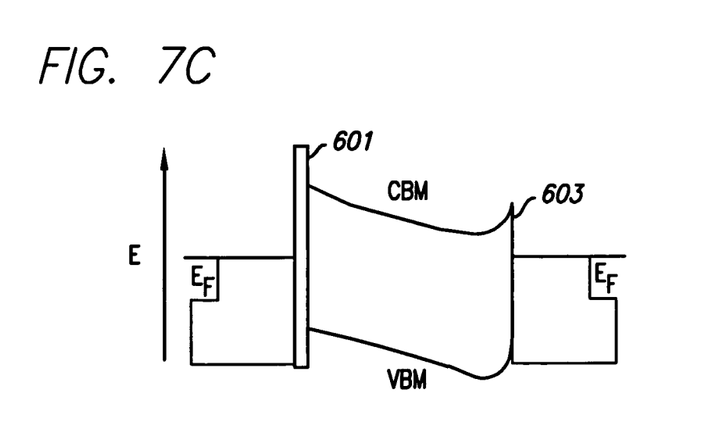
FIG. 7C is the energy band diagram associated with the switch.

In FIGS. 7A-7C, which represent the initial stage of turning the switch ON, pushing oxygen vacancies away from the anode means that the $TiO_{2-x}$ is being oxidized, i.e., the value of x is decreasing by a small amount E. Because of the initially large concentration of vacancies near the anode 104, this small oxidation has very little effect on the electronic conductivity of region 310. On the other hand, the initially stoichiometric or oxidized material near the cathode is being reduced, e.g. the stoichiometry is now $TiO_{2-x'}$. This has a significant impact on the energy bands in the middle of the nanocrystal, as shown in FIG. 7C. The total effective barrier width for electron tunneling through the nanocrystal is reduced, and the conductivity increases.

Figure 8A:
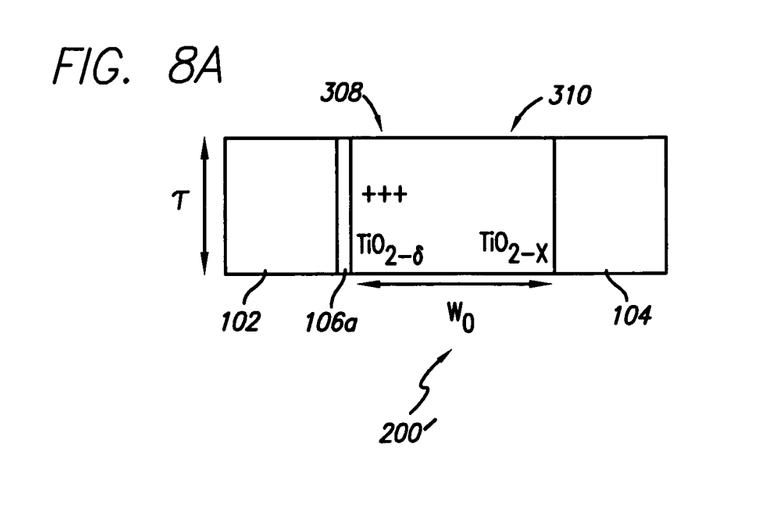
FIG. 8A is a view of the switch.
Figure 8B:
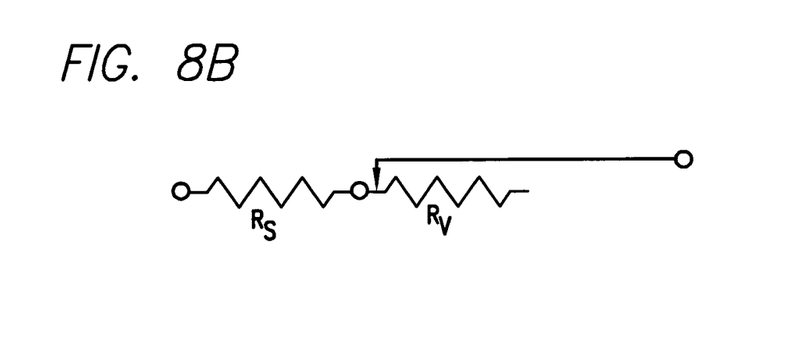
FIG. 8B is an equivalent circuit diagram of the state of the switch.
Figure 8C:
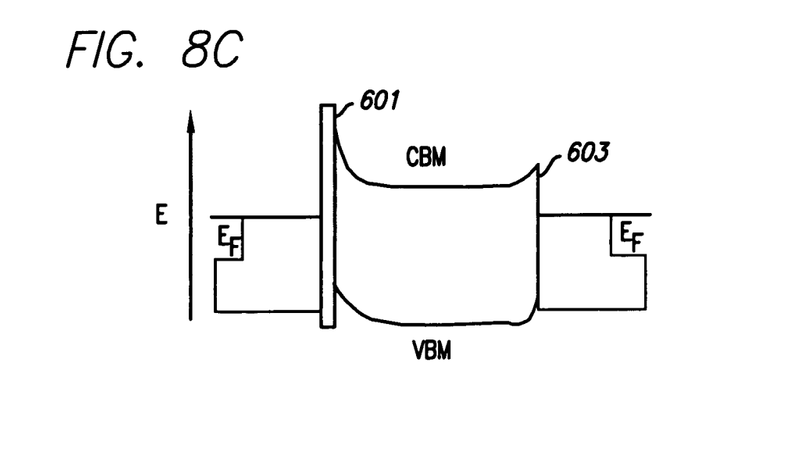
FIG. 8C is the energy band diagram associated with the switch.

If the bias is increased or applied for a longer time, more oxygen vacancies will drift to the left and narrow the tunneling barrier even more, as shown in FIGS. 8A-8C. The switch is now fully in the ON-state, with even more vacancies now in 308, such that the stoichiometry of this region is denoted $TiO_{2-\delta}$. Inverting the polarity of the voltage on the right-hand electrode 104 reverses the sense of anode and cathode and causes the oxygen vacancies to drift back to the right-hand side, recovering the state of FIGS. 6A-6C and turning the switch back OFF if this reversed polarity bias is applied for a long enough time.

Without subscribing to any particular theory, it appears that the molecules in the noncovalent region 106a in the device only play a passive role. They form a thin insulating region between the first Pt electrode 102 and the nanocrystal 308, which can assist in the formation of the Schottky barrier. The fact that this interface 601 of the nanocrystal is not covalently bonded to the Pt electrode may make it easier for oxygen vacancies to drift toward this interface, since there is essentially an internal free surface to accommodate lattice distortions. Finally, although the crystal 308, 310 presented here is considered a nanocrystal, it may be that the primary role of the molecules 106a is to ensure that the primary active material, e.g., titanium dioxide, 308 is actually amorphous.

As shown in FIGS. 6B, 7B, and 8B, the equivalent circuit is just two resistors in series: one resistor $R_S$ that represents the series resistance of the wiring and any component of the switch that does not change with time, and a variable resistor $R_V(t)$ that changes with time depending on the applied voltage and currents that flow through it. Assuming Ohm's law applies (instead of the tunneling resistance that actually occurs, which dramatically complicates the mathematics), $$V(t) = I(t)[R_S + R_V(t)]. \qquad 1.$$

The variable resistance is proportional to the width w(t) of the stoichiometric $TiO_2$ 308 present in the nanocrystal, $$R_V(t) = \rho w(t)/A, \qquad 2.$$

where the material behind the drift front of the vacancies is considered to have essentially zero resistance, ρ is the resistivity of the undoped titanium dioxide and A is the area of the nanocrystal normal to the direction of current flow. For the initial condition in which the switch is OFF and a bias is applied to turn it ON, the rate of change of the width of undoped titanium dioxide is just the vacancy drift rate in the applied field across the undoped width, $$\frac{dw}{dt} = -\mu_V E(t) = -\mu_V \rho I(t)/A, \qquad 3.$$

where $\mu_V$ is the mobility of oxygen vacancies in titanium dioxide, E(t) is the electric field across the undoped material, which is just the voltage drop ρ w(t) I(t)/A divided by the width w(t), and the minus sign appears because the width of the undoped region is decreasing. Integrating equation 3, this becomes $$w(t) = w_0 - \frac{\mu_V \rho}{A} \int_0^t I(t) dt, \qquad 4.$$

where $w_0$ is the width of the undoped titanium dioxide at t=0, and w(t) is defined such that it cannot be negative. The full equation relating V and I becomes $$V(t) = I(t)\left[R_S + \frac{R_0}{w_0}\left(w_0 - \frac{\mu_V \rho}{A} \int_0^t I(t) dt\right)\right]. \qquad 5.$$

Thus, the assumptions made above yield a fairly complex mathematical expression in which the voltage at time t of the switch involves the integral of the current and/or voltage over time, which introduces a path dependence to the switch. Equation 5 is illustrative of a wider variety of descriptive equations for the switch operation, and the present invention includes ion drift switching mechanisms that are described by other equations. For example, if space-charge is important for the ion drift, then the functional dependence on the current in equation 5 goes from an integral over the current to the first power (I) to an integral over the second power ($I^2$). The most efficient circuit model for such a system may require a memristor. As seen in the sequence of the equivalent circuit in going from FIG. 6B to FIG. 7B to FIG. 8B, the switch is closing, so w(t) and thus $R_V(t)$ are getting smaller with time; that is, the resistance is going down to turn the switch ON.

FIG. 6C shows the energy-band diagram representation of the OFF-state of a switch that has metal contacts 102, 104 on both sides. Because there is essentially no doping in the semiconducting region 308, there is a relatively high barrier at both metal-semiconductor junctions. Note that toggling the switch is not strictly a binary operation—the conductance of the switch can be varied over a wide range depending on how many dopant species are injected into or created inside the primary material. The donor species are moved by applying a voltage bias across the junction (alternately, they can be formed chemically, for instance by reducing $TiO_2$ with a metal to form $TiO_{2-x}$ or removed by reacting with molecular oxygen). Thus, there are no free carriers in the semiconductor layer, and it therefore acquires a net positive charge. The over-all effect of this positive charge is to bend the bands of the semiconductor down with respect to the metal Fermi level (FIG. 7C), which in turn lowers the tunnel barrier of the junction and thus increasing the conductivity. The creation or injection of these dopants is greatly enhanced by having an appropriate source layer 310 adjacent the semiconductor 308. This material 310 may be, for example, an ionic conductor that can act as a source or sink of atoms for the semiconductor 308 (e.g., various dopant species or a sink for O atoms to enable the formation of oxygen vacancies in an oxide semiconductor layer).

FIG. 7C shows the bands of the system after further dopant sites have been injected into the semiconductor 308, forming $TiO_{2-\epsilon}$. The semiconductor bands have been bent down further by the increased positive charge within the depleted semiconductor, further lowering the tunneling barrier and increasing the conductivity. In the case of $TiO_{2-x}$, O vacancy sites in the lattice create states that reside very near the conduction band, so with a high enough doping level the conduction band of the nanocrystal will be pulled down to the Fermi level of the metal contacts. At this stage, the tunnel barriers at each metal junction are becoming thinner, and the conductivity of the system is increasing. This is the initial stage of turning the switch ON.

In FIG. 8C, even more dopant donors have been injected into the semiconductor 308, forming $TiO_{2-\delta}$. The semiconductor conduction bands have been bent down further by the increased positive charge within the depleted semiconductor, thus decreasing the width and height of the tunnel barrier and increasing the conductivity of the layer. This is the fully switch-ON state of the system.

As long as the doping level of the semiconductor film 308 is not so large that the resistance drops essentially to zero, it is possible to reverse the drift of the donor dopant ions and eject them from the semiconductor by reversing the polarity of the voltage applied to the switch.

Doping of the semiconductor layer 308 is a function of both voltage (to exceed any energy barrier for ion drift) and time (the longer the system is held at voltage, the more dopants accumulate), or the integral of the current.

In the description above, the switches are designed and fabricated to have a particular ON/OFF polarity. The switch is turned ON by applying a positive voltage bias to the electrode that has the excess of positively charged dopant species, and it is turned OFF by applying a negative voltage bias to that same electrode. However, it is possible to also design and fabricate switches with a configurable polarity, e.g., to determine the ON/OFF polarity of a switch during an electronic configuration process performed after a circuit containing switches has been fabricated. This configuration step is also known as field programming. This may be done by creating a structure in which the material next to both metal electrodes has no doping, and the material in the middle has an excess of dopants. Thus, during an initial programming stage for a circuit, a negative voltage bias to attract positively charged dopants may be applied to those electrodes that one desires to be the ON electrode for an applied positive bias, and conversely a positive voltage to repel positively charged dopants may be applied to those electrodes that one desires to be the OFF electrode for an applied negative bias. In this fashion, it is possible to configure an array of switches such that the ON/OFF polarity of the upper electrodes of the switches alternates. This particular configuration is especially useful if one is building an array of latches, for example. It is also possible to invert the ON/OFF polarity of any switch disclosed in this application by applying a positive bias voltage to the ON electrode for a long enough time that the dopants all drift to the opposite electrode of the switch.

Figure 9A:
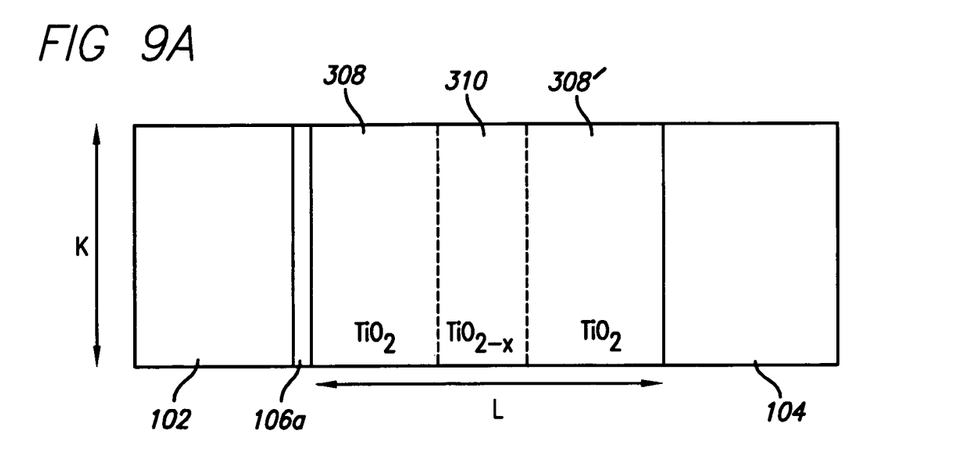
FIGS. 9A-9C are schematic diagrams of another embodiment of the switch, depicting the movement of dopants.
Figure 9B:
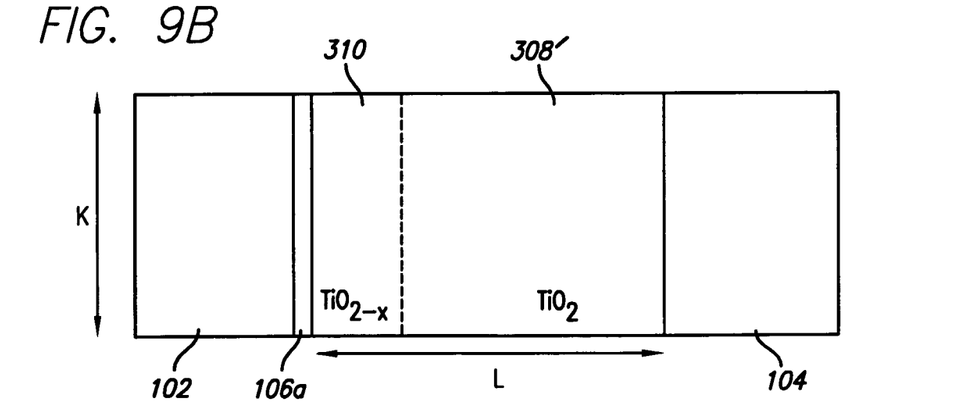
Figure 9C:
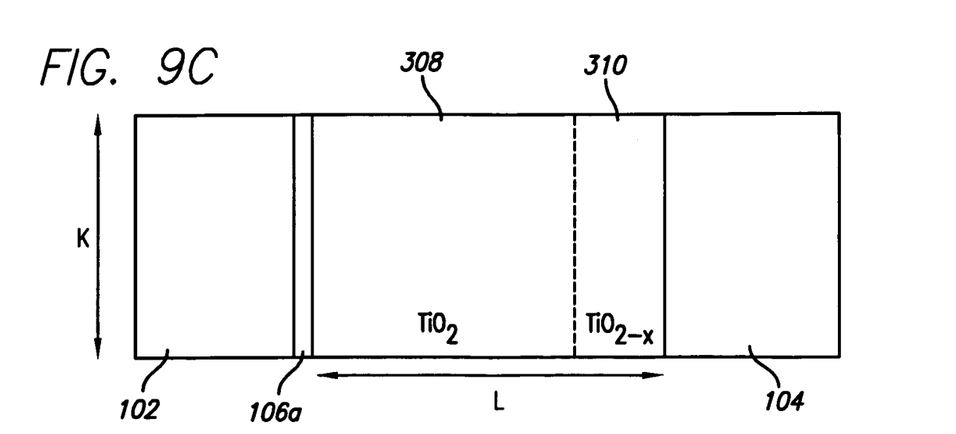

FIGS. 9A-9C depict the configurable ON/OFF polarity switch described above, in which the dopant source layer 310 is sandwiched between two primary active layers 308, 308'. In this embodiment, the thickness of the switch is given by K and the total width of the $TiO_2/TiO_{2-x}/TiO_2$ layer 308, 310, 308' is given by L.

In FIG. 9A, ionized dopants originally in the dopant source layer 310 are moved to either of the two primary active layers 308, 308' by applying the appropriate bias voltage to set the ON/OFF polarity of the switch.

Applying a positive bias voltage to electrode 104 (of the switch shown in FIG. 9A) causes positively-charged dopants, oxygen vacancies in the case of the $TiO_2/TiO_{2-x}$ system, to drift to the left. This will set the ON/OFF polarity of the switch such that a subsequent negative bias voltage applied to electrode 104 will turn the switch ON and a positive voltage applied to electrode 104 will turn the switch OFF. The resulting structure is depicted in FIG. 9B.

Conversely, applying a negative bias voltage to electrode 104 (of the switch shown in FIG. 9A) causes positively-charged dopants, oxygen vacancies in the case of the $TiO_2/TiO_{2-x}$ system, to drift to the right. This will set the ON/OFF polarity of the switch such that a subsequent positive bias voltage applied to electrode 104 will turn the switch ON and a negative voltage applied to electrode 104 will turn the switch OFF. The resulting structure is depicted in FIG. 9C. Thus, Figures 9B and 9C represent switches with opposite ON/OFF polarity.

Fabricating the Electrically Actuated Switches.

The switches disclosed herein may be fabricated using a wide range of material deposition and processing techniques. First, the initial wire 102 (metal or semiconductor) is fabricated using conventional techniques such as photolithography or electron beam lithography, or by more advanced techniques, such as imprint lithography. This may be a bottom wire 102 of a crossed-wire pair 100 as shown in FIG. 1 or it may be a wire 102 that is being created in a via to create a connection 200 normal to the plane of a circuit as shown in FIG. 2, for example.

In the scheme described here, the next component of the switch to be fabricated is the non-covalent interface material 106a, and may be omitted if greater mechanical strength is required, at the expense of slower switching at higher applied voltages. This is an optional component of the switch 200' (or switch 100'), as mentioned above. In this case, a layer 106a of some inert material is deposited. This could be a molecular monolayer formed by a Langmuir-Blodgett (LB) process or it could be a Self-Assembled Monolayer (SAM). In general, this molecular layer 106a may form only weak van der Waals-type bonds to the bottom electrode 102 and the primary active material 308 of the switch. Alternatively, this layer 106a may be a thin layer of ice deposited onto a cooled substrate. The material to form the ice may be an inert gas such as argon (Ar) or it could be a species such as carbon dioxide ($CO_2$). In this case, the ice is a sacrificial layer that prevents strong chemical bonding between the bottom electrode and the switch material, and is lost from the system by heating the sample later in the processing sequence to sublime the ice away. One skilled in this art can easily conceive of other ways to form weakly bonded interfaces between the electrode 102 and the switch 306.

Next, the material for the primary active layer 308 is deposited. This can be done by a wide variety of conventional physical and chemical techniques, including evaporation from a Knudsen cell, electron beam evaporation from a crucible, sputtering from a target, or various forms of chemical vapor or beam growth from reactive precursors. The film may be in the range from 1 to 30 nanometers (nm) thick, and it may be grown to be free of dopants. In this case, the as-grown structure is switch-OFF. Depending on the thickness of the film 308, it may be nanocrystalline, nanoporous or amorphous in order to increase the speed with which ions can drift in the material to achieve doping by ion injection or undoping by ion ejection from 308. Appropriate growth conditions, such as deposition speed and substrate temperature, may be chosen to achieve the chemical composition and local atomic structure desired for this initially insulating or low conductivity film 308.

The next layer is the dopant source layer, or secondary active layer, 310 for the primary switching material 308, which may also be deposited by any of the techniques mentioned above. This material is chosen to provide the appropriate doping species for the primary active material. This secondary material 310 is chosen to be chemically compatible with the primary material 308, e.g., the two materials should not react chemically and irreversibly with each other to form a third material. If one is fabricating switches to be configured later, another layer primary material 308' is then deposited on top of the secondary material 310.

As mentioned above, one example of a pair of materials that can be used as the primary 308 and secondary 310 active switching layers is $TiO_2$ and $TiO_2$-x, respectively. $TiO_2$ is a semiconductor with an approximately 3.2 eV bandgap. It is also a weak ionic conductor. A thin film of $TiO_2$ will create the tunnel barrier required to create the switch-OFF configuration, and the $TiO_{2-x}$ forms an ideal source of oxygen vacancies to dope the $TiO_2$ and make it conductive. A second film of the primary active material $TiO_2$ 308' can be deposited if one desires to fabricate a configurable ON/OFF polarity switch.

Finally, the second metal electrode 104 is fabricated on top of the secondary active layer 310 or the second primary active layer 308' of the switch, in a manner similar to which the first wire 102 was created. If the system is a crossed-wire device 100', an etching process is used to remove the deposited switching material that is not under the top wires in order to isolate the devices. If desired, a planarization process can be added after depositing the bottom set of wires or after the second set of wires to provide a flat surface on top of the switches.

An issue with respect to fabricating switch devices is to carefully control the dopant concentration in the material, whether that dopant is the presence of a different type of atom or the absence of a particular atom (e.g., a vacancy) from the lattice. The dopant species may be introduced into the growth medium or the amount of one component may be decreased in order to induce vacancies. Another approach is to grow a high quality and pure layer of the host material, and then to deposit a carefully determined amount of a species directly on top of the host material. This may be a dopant species that will then diffuse into the host material, or it may be a reactive material that will react chemically with one of the components of the host to induce vacancies in the host lattice. An example of such an approach is to deposit a small amount of aluminum on top of a high quality and pure layer of titanium dioxide. The aluminum reacts partially with the oxygen of the titanium dioxide to form some alumina and leave vacancies in the titanium dioxide. This is a process similar to "delta doping" currently practiced in the semiconductor industry to provide a very thin layer of very highly doped semiconductor material.

Material Combinations for Switching.

There is a wide range of materials that exhibit the desired combination of properties: electronically semiconducting or insulating and "weakly" ionic conductor to enable dopant species to be injected by drift into and ejected out of the active region of the switch. In general, excellent switching materials are the compound semiconducting oxides and nitrides, but semiconducting sulfides, phosphides, chlorides, selenides, arsenides, and bromides also provide switching. In general, any semiconducting material that is also a weak ionic conductor with respect to species that can electrically dope the semiconductor will work in the practice of the present invention and its various embodiments. In other words, possible switch compounds are semiconducting compounds with significant ionic contribution to the bonding. A good combination is a primary active material that is undoped and stoichiometric, and thus a good insulator, combined with a secondary source/sink of the same or related parent material that either contains a large concentration of anion vacancies or other dopant species that can be drifted into the primary material under the application of an applied bias voltage. The idea is that the source/sink system 310 is very conductive and thus changing the doping concentration has a relatively small effect on the conductivity of this secondary material, but since the primary material 308 is essentially intrinsic, then even a small amount of dopant will have a very dramatic effect on the conductivity of this material.

The switching compounds employed in the practice of the present invention are generally the oxides, sulfides, selenides, nitrides, phosphides, arsenides, chlorides, and bromides of the transition and rare earth metals, with the alkaline earth metals often being present in compounds. Further, there are the various alloys of like compounds with each other, which can have a wide range of composition if they are mutually soluble in each other. Then there are the mixed compounds, in which there are two, three or more different metal atoms combined with some number of the electronegative elements. The dopants may be anion vacancies or different valent elements doped into the host.

Materials involving the elements Ti, Zr and Hf are particularly attractive for switches that can be compatible with Si integrated circuit technology, since the primary oxidation state of all three metals is +4, the same as Si, and therefore these elements would not create unintentional doping of the Si. These compounds are also known as titania, zirconia, and hafnia, respectively, and also by other names specific to the various polytypes of each.

Another embodiment includes the alloys of these three oxides in pairs or with all three present simultaneously (e.g., $Ti_xZr_yHf_zO_2$, where x+y+z=1). Related sets of compounds include the titanates, zirconates and hafnates, which are represented by the specific example $SrTiO_3$, where Sr is the divalent element strontium. There is a wide variety of such compounds in which Ca, Ba, and other divalent elements (e.g., Mg, Zn, Cd) may be substituted for Sr, and Zr and Hf substituted for Ti. These compounds may be represented as $ABO_3$ compounds, where A is at least one divalent element and B is at least one of Ti, Zr, and Hf, and may have the perovskite structure.

It is also possible to utilize alloys of these various compounds, such as $Ca_xSr_bBa_cTi_xZr_yHf_zO_3$, where a+b+c=1 and x+y+z=1. There is also a wide variety of other oxides of the transition and rare earth metals with different valencies that may be used, both individually and as more complex compounds. In each case, the ionized dopant species may be an oxygen vacancy or an aliovalent (e.g., different valence) element doped into the host material.

Yet another embodiment of compounds includes the sulfides and selenides of the transition metals with some ionic bonding character, essentially the S and Se analogues of the oxides mentioned above.

Still another embodiment of compounds includes the semiconducting nitrides, such as AlN, GaN, ScN, YN, LaN, rare earth nitrides, and alloys of these compounds and more complex mixed metal nitrides.

A still further embodiment of compounds includes the phosphides and arsenides of various transition and rare earth metals, e.g., Sc, Y, La, etc.

Yet another embodiment of compounds includes the semi-conducting halides, such as CuCl, CuBr, and AgCl.

In all cases, either anion vacancies or aliovalent elements can be used as the mobile dopant species in the compounds above.

It is also possible to fabricate a primary active layer or a secondary active layer from sublayers of different materials or compounds chosen from the examples above.

The dopants employed in the practice of the various embodiment are selected from the group consisting of hydrogen, alkali, and alkaline earth cations, transition metal cations, rare earth cations, oxygen anions or vacancies, chalcogenide anions or vacancies, nitrogen anions or vacancies, pnictide anions or vacancies, or halide anions or vacancies.

Specific examples of the combination of primary materials 308 and secondary materials 310, along with the dopant species employed for each combination, are set forth in the Table below. Based on the teachings herein, it is clear that one skilled in this art can develop other combinations of primary and secondary materials that provide the benefits taught.

TABLE

List of Examples of Compatible Primary and Secondary Materials and Dopant Species.

| Primary Material | Secondary Material | Dopant Species |
|---|---|---|
| $TiO_2$ | $TiO_{2-x}$ | Oxygen vacancies |
| $ZrO_2$ | $ZrO_{2-x}$ | Oxygen vacancies |
| $HfO_2$ | $HfO_{2-x}$ | Oxygen vacancies |
| $SrTiO_3$ | $SrTiO_{3-x}$ | Oxygen vacancies |
| GaN | $GaN_{1-x}$ | Nitrogen vacancies |
| CuCl | $CuCl_{1-x}$ | Chlorine vacancies |
| GaN | GaN:S | Sulfide ions |

Further Considerations.

As discussed above, the conductance of the switch can be varied over a wide range. The embodiments described below are with respect to the fact that the switches described herein are actually continuous—e.g., the resistance of the switches changes continuously, but somewhat abruptly, from the OFF state to the ON state and back. This is shown explicitly in the schematic diagrams (FIGS. 6B, 7B, 8B) of the switch equivalent circuit, which shows a variable resistor in series with a fixed resistor.

There are many applications for a variable or analog switch in an electronic circuit.

In one embodiment, an electronically settable variable resistor can be used as a trimming resistor to adjust the impedance of a circuit. There is a certain amount of variability in all electronic circuits, which means that circuits that are fabricated will have slightly different operating parameters, in terms of their speed of operation and the delay time for signals to propagate through the circuit. In the past, this problem was handled by installing mechanically adjustable "trim pots" in circuit boards. An expert engineer was required to test and tune up a circuit in order to optimize its properties—this was done by examining the electronic signal at various test points on a circuit board using an oscilloscope, and then using a screw driver to adjust the trim pot, in other words to change the resistance of the variable resistor to bring the impedance of the circuit up to its optimal performance. This was required when first testing a circuit to ensure that it worked properly, and with time, various elements in a circuit could change, so an expert technician was required to retest and retune a circuit in the field. As circuits became more integrated, this requirement for tuning became less necessary, as the reproducibility of integrated circuit components improved. Also, there is no place on an integrated circuit to place a trim pot, so for the most part, integrated circuits cannot be tuned. As feature sizes are getting smaller, the variability of component properties is necessarily increasing, just because a single atom determines the lower limit of the uncertainty in a feature size. Thus, future generations of circuits will need to have trim pots to be able to tune and optimize the circuits. In fact, as device variability gets larger, it will be likely that circuits will not work at all if they cannot be tuned. Thus, we would use switches in various positions within an integrated circuit along with feedback circuits to enable a circuit not only to be tuned up when it was first turned on, but also to continually optimize the performance of a circuit during operation. Thus, it should be possible for a circuit with such switches and feedback elements to continually improve with time. As certain components in the circuit failed, the circuit would use the switches to reconfigure and re-optimize itself. Thus, such circuits should have the ability to degrade gracefully with age, rather than die a sudden death when a single component failed.

In another embodiment, in addition to a circuit needing to be tuned up, it is also desirable to change the operating characteristics of some circuits to match a particular signal input for making various measurements. For example, many transducers or measurement systems perform best when there is a "bridge circuit", in which the resistance of a variable resistor is tuned in order to balance a differential circuit to make a very precise measurement. One example is measuring a precise voltage difference for a thermocouple, but there are many other examples of bridge circuits used for measurements.

In yet another embodiment, an application of analog switches is in learning circuits or neural nets. In these circuits, a training procedure is used to teach a circuit how to respond to a particular input. This is done by comparing the properties of a component to an expected property, and resetting the value of the component in response to the input value using a feedback approach. Today, most neural nets are implemented in software using conventional integrated circuits and processing units—a true neural net implemented in hardware with adjustable analog switches will be far more efficient.

In still a further embodiment, other analog and mixed analog and digital circuits can be improved by having a continuously tunable resistance that is non volatile—e.g., a baseline value for the resistor is set during an initialization phase, and after that during operation the resistance is adjusted in order to respond to operating conditions of the circuit. This may be done, for example, to compensate for changes in the fundamental operating characteristics of the circuit with changes in temperature or fluctuations in power supply voltages or other changing environmental conditions.

The foregoing description, for purposes of explanation, used specific nomenclature to provide a thorough understanding of the invention. However, it will be apparent to one skilled in this art that the specific details are not required in order to practice the invention. The foregoing description of specific embodiments of the present invention is presented for the purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in this art to best utilize the invention and various embodiments with various modifications as are suited to the particular use contemplated. It is intended that the scope of the invention be defined by the following claims and their equivalents.

What is claimed is:

1. An electrically actuated switch having a configurable ON/OFF polarity comprising:
   a first electrode;
   a second electrode;
   an active region disposed therebetween, said active region comprising
   a first primary active region and a second primary active region, each comprising at least one material for transporting and hosting ions that act as dopants to control the flow of electrons through the switch, and
   a secondary active region disposed between said first primary active region and said second primary active region and comprising at least one material for providing a source/sink of ionic dopants for said primary active regions;
   the switch capable of being configured into a given state by initially causing said dopants to drift toward either of said first electrode or said second electrode to set an initial ON/OFF polarity of said switch;
   wherein said switch has three states:
   in an initial state, there is undoped semiconductor adjacent to both electrodes, resulting in first and second Schottky barriers that are in series and opposed to each other (or have opposite polarities), thereby effectively blocking current flow in both directions of the device,
      when said switch is switched to a second state for which dopants are injected into a region near the first electrode, the first Schottky barrier adjacent to the first electrode is decreased, which results in current flowing more readily in one direction compared to the opposite direction, and
      when said switch is switched to a third state for which dopants are injected to a region near the second electrode, the second Schottky barrier adjacent to the second electrode is decreased, which results in a reversal of a direction of easier current flow.

2. The switch of claim 1 in which the direction of easier current flow in the switch is used to store a bit of information, with current flow in one direction corresponding to a 1 and current flow in the opposite direction corresponding to a 0.

3. A method for reversibly switching between two different states in an electrically actuated switch comprising a first electrode, a second electrode;
   an active region disposed therebetween, said active region comprising a first primary active region and a second primary active region, each comprising at least one material for conducting and hosting ions that act as dopants to control the flow of electrons through said switch, and a secondary active region disposed between said primary active region and said second primary active region and comprising at least one material for providing a source/sink of ionic dopants for said primary active regions; and
   a voltage source for initially causing said dopants to drift toward either of said first electrode or said second electrode, said method comprising performing at least one of the following steps at least once:
   either:
      impressing a positive voltage on said second electrode for a long enough time to cause the positive ionic dopants from said secondary active region to be injected into said primary active region near said first electrode, thereby defining the ON/OFF polarity of said second electrode to be the ON state when said second electrode is biased negatively or the OFF state when said second electrode is biased positively during operation of the switch; or
      impressing a negative voltage on said second electrode for a long enough time to cause the positive ionic dopants from said secondary active region to be injected into said primary active region near said second electrode, thereby defining the ON/OFF polarity of said second electrode to be the ON state when said second electrode is biased positively or the OFF state when said second electrode is biased negatively during operation of the switch;
      wherein:
         in an initial state of the switch, there is undoped semiconductor adjacent to both electrodes, resulting in two Schottky barriers in series that are opposed to each other (or have opposite polarities), thereby effectively blocking current flow in both directions,
         when switched to a second state, the Schottky barrier adjacent to one electrode is decreased, which results in current flowing more readily in one direction compared to the other, and
      when switched to a third state, the Schottky barrier adjacent to the other electrode is decreased, which results in a reverse of a direction of easier current flow, thereby inverting the direction of easier current flow.

* * * * *